United States Patent [19]
Liddell

[11] 3,715,628
[45] Feb. 6, 1973

[54] CARD MOUNTING CHASSIS

[75] Inventor: Arlyn G. Liddell, Bountiful, Utah

[73] Assignee: Eaton Corporation, Cleveland, Ohio

[22] Filed: July 26, 1971

[21] Appl. No.: 166,172

[52] U.S. Cl. ..........317/101 DH
[51] Int. Cl. ..........H02b 1/02
[58] Field of Search.317/101 DA, 101 CB, 99, 101D

[56] References Cited

UNITED STATES PATENTS

| | | | |
|---|---|---|---|
| 3,443,161 | 5/1969 | King | 317/101 CB |
| 3,394,287 | 7/1968 | Ztizmann et al. | 317/101 CB |

*Primary Examiner*—David Smith, Jr.
*Attorney*—Lynn G. Foster

[57] ABSTRACT

Means for mounting logic cards on a device to be controlled thereby comprising a housing having a connector bar mounted therein for releasably receiving a plurality of logic cards and having all inter-card connections made internally of the housing, the housing being releasably securable to the device to be controlled, and having a connector bar carried by the device to be controlled connectable to the logic cards while the logic cards are retained in the housing, and having all connections between the logic cards and external equipment made through the connector bar carried by the device to be controlled.

5 Claims, 4 Drawing Figures

CARD MOUNTING CHASSIS

BACKGROUND

1. Field of Invention

This invention relates to mounting means for logic circuit cards and is particularly directed to a card mounting chassis which provides a self-contained, wholly removable logic card file containing all inter-card wiring thereon.

2. Prior Art

In the computer and automatic control arts, logic circuits are widely used, and these logic circuits are usually formed of a plurality of printed circuit boards or cards each containing various components of the logic circuitry. Conventionally, such cards are releasably attached to connector strips which are mounted on the equipment to be controlled and wiring for inter-card connections is also mounted on such equipment. Unfortunately, failures sometimes occur in the logic circuitry and it is often a difficult and time-consuming job to locate the source of the failure. Moreover, while this is being done, the controlled equipment must be taken out of service, which magnifies the importance and expense of such failures.

BRIEF SUMMARY AND OBJECTS OF THE INVENTION

These advantages of the prior art are overcome with the present invention and novel means is provided which permits continued use of the controlled equipment, while a logic circuit failure is isolated and corrected, and which, thereby, greatly reduces the problems and expense created by such failures.

The advantages of the present invention are preferably attained by providing a chassis on which all of the cards of the logic circuit, together with all inter-card wiring, are mounted and which can be quickly and easily connected to or disconnected from the controlled equipment. Thus, in the event of a logic circuit failure, the entire logic circuit may be readily replaced by substitute, while the original is tested to isolate and correct the cause of the failure.

Accordingly, it is an object of the present invention to provide improved means for mounting logic circuit cards and the like.

Another object of the present invention is to provide means for minimizing the "down time" of controlled equipment due to a failure in the logic circuit controlling the equipment.

A specific object of the present invention is to provide a chassis on which all of the cards of a logic circuit, together with all inter-card wiring, may be mounted and which can be quickly and easily connected to or disconnected from the controlled equipment.

These and other objects and features of the present invention will be apparent from the following detailed description, taken with reference to the accompanying drawings.

DETAILED DESCRIPTION OF THE ILLUSTRATED EMBODIMENT

Figure 1:
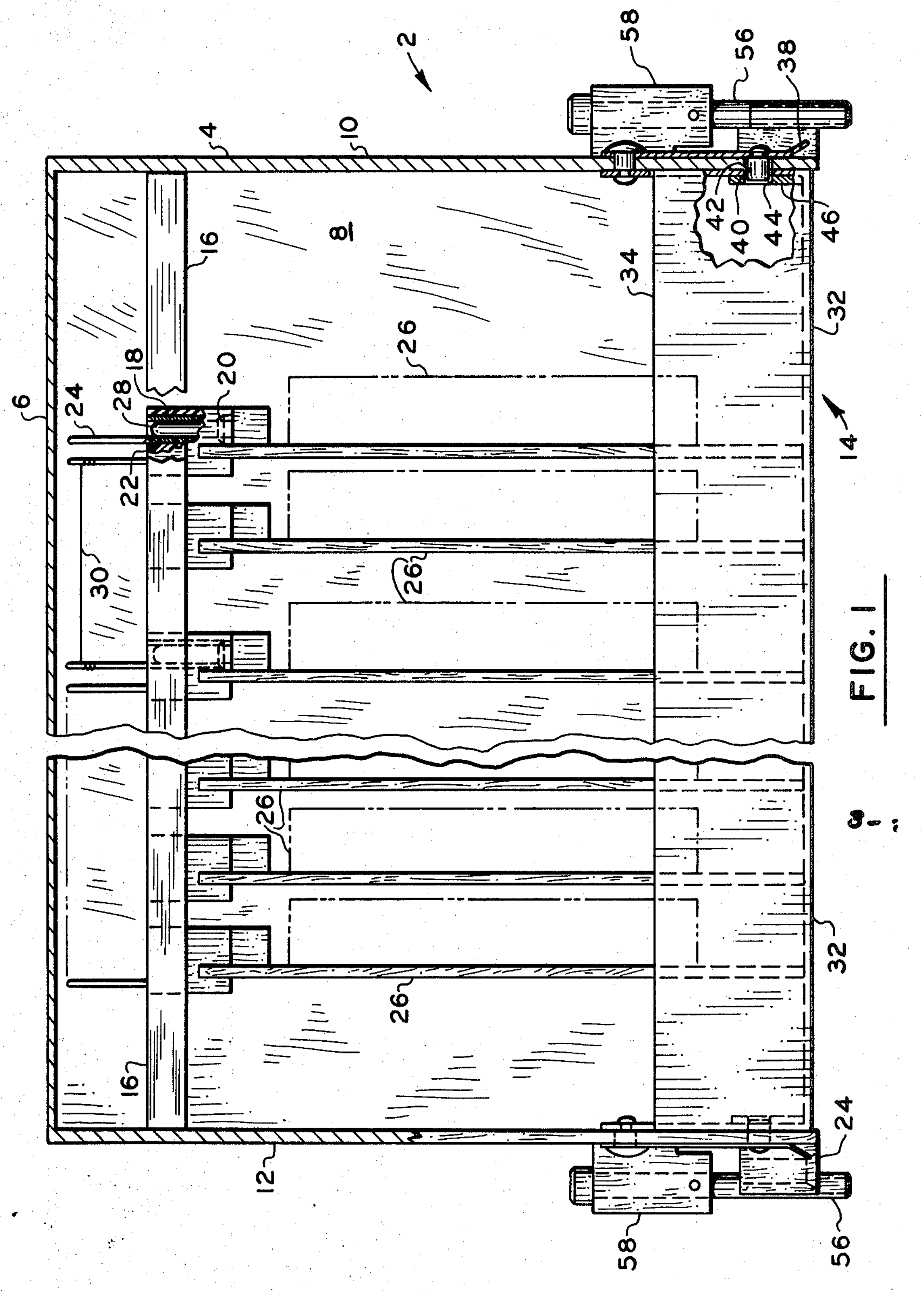
FIG. 1 is a longitudinal section through a logic card mounting chassis embodying the present invention.
Figure 2:
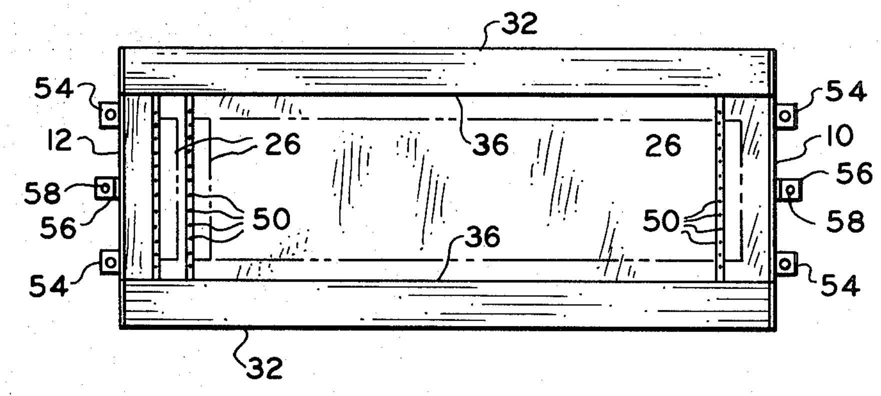
FIG. 2 is a bottom view of the chassis of FIG. 1.

In that form of the present invention chosen for purposes of illustration, FIGS. 1 and 2 show a card mounting chassis, indicated generally at 2, comprising a housing 4 having a top 6, sides 8, and end panels 10 and 12. The bottom of the housing 4 is open, as indicated at 14. A connector bar 16 is mounted in the housing 4 adjacent, but spaced from the top 6 and extends longitudinally the full length of the housing 4. The connector bar 16 is composed of electrically insulating material and is formed with a plurality of apertures 18 extending therethrough. In each of the apertures 18 is permanently mounted a connector 20 having a female portion 22, located within the aperture 18 and a male portion 24 projecting from the connector bar 16 toward the top of housing 4. A plurality of logic circuit cards, indicated diagrammatically at 26, each carry a plurality of male connectors 28 and are connected to the chassis 2 by inserting the male connectors 28 of the logic cards 26 into the female portions 22 of appropriate ones of the connectors 20 of connector bar 16. All inter-card connections are, then, made by connecting appropriate ones of the male portions 24 of the connectors 20, by suitable conductive means such as wires 30.

Figure 3:
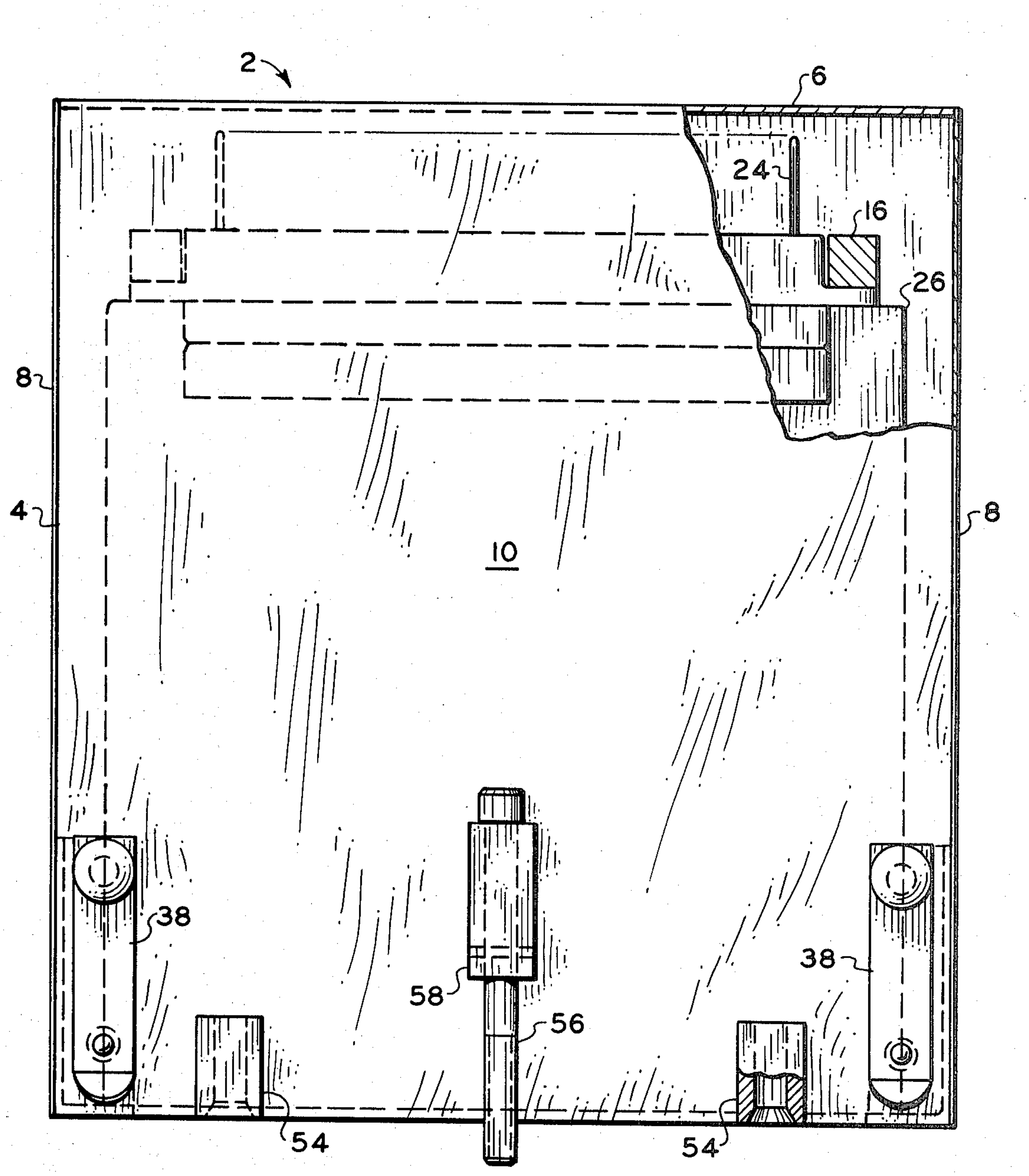
FIG. 3 is an end view of the chassis of FIG. 1.

To retain the logic cards 26 in the chassis 2, a pair of L-shaped retaining members 32 are provided and are hingedly secured to the lower edges of the sides 8 of housing 4, as seen at 34. As best seen in FIGS. 2 and 3, the retaining members 32 are formed with inwardly extending flanges 36 which extend towards each other across the open bottom 14 of the housing 2 and underlie the edges of the logic cards 26 to prevent the logic cards 26 from dropping out of the chassis 2. Resilient latch means 38 are mounted on the end panels 10 and 12 of housing 2 and are provided with pins 40 which are urged through openings 42 in the end panels 10 and 12 to engage openings 44 in dogs 46 carried by the retaining members 32 to prevent inadvertent opening of the retaining members 32.

Figure 4:
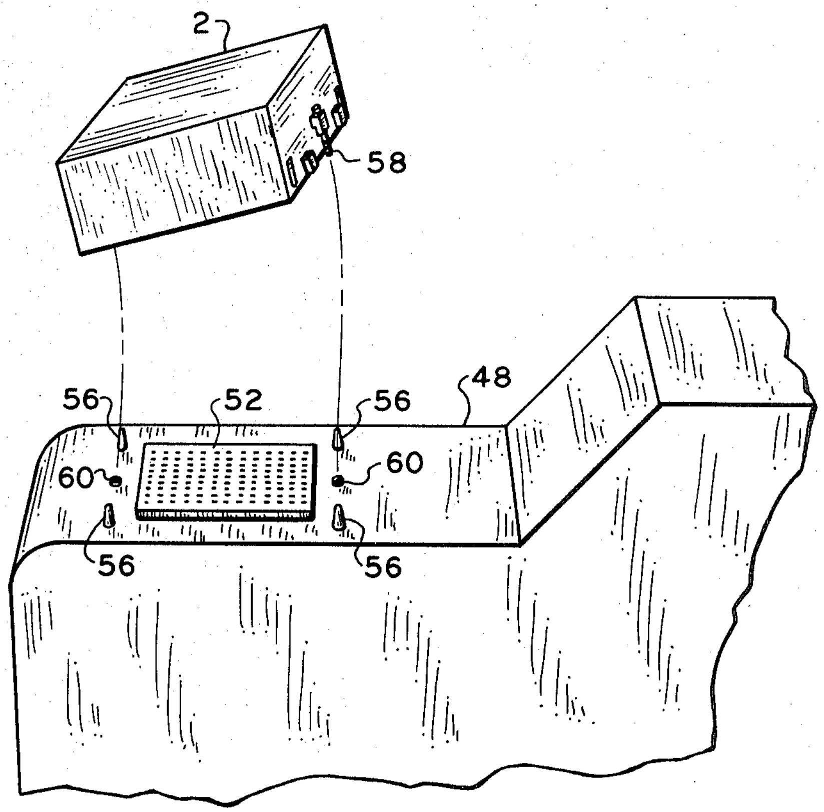
FIG. 4 is an isometric view showing the chassis of FIG. 1 being mounted on a controlled device.

To assemble the chassis 2 to the device to be controlled, indicated at 48 in FIG. 4, the logic cards 26 are provided with male connectors 50, similar to the male connectors 28, which mate with a connector bar 52 mounted on the device 48. The connector bar 52 is generally similar to connector bar 30 and all connections between the logic cards 26 and equipment external to the logic circuit are made through connector bar 52. The chassis 2 is preferably provided with female alignment studs 54, mounted on the end panels 10 and 12 of housing 4, which mate with male alignment studs 56 carried by the device 48 adjacent the connector bar 52. In addition, threaded fasteners 56 pass through bosses 58 on the end panels 10 and 12 of housing 4 and mate with threaded recesses 60 provided on the device 48 to secure the chassis 2 to the device 48.

In use, should a failure occur in the logic circuit, the entire logic circuit may be quickly replaced by loosening fasteners 56, removing the chassis 2, and substituting a similar chassis 2 containing a properly functioning logic circuit. Hence, the controlled device 48 may be returned to service in a matter of minutes. Thereafter, at a convenient time and place, the chassis 2 containing the faulty logic circuit may be opened and the components of the logic circuit may be tested to isolate and correct the failure.

Obviously, numerous variations and modifications may be made without departing from the present invention. Accordingly, it should be clearly understood that the form of the present invention described above and shown in the accompanying drawing is illustrative only and is not intended to limit the scope of the present invention.

What Is Claimed Is:

1. Logic circuit mounting means comprising:

a plurality of logic cards having electrical connectors disposed along opposite edges thereof; and a card mounting chassis having an open-bottomed generally box-like housing, a connector bar mounted in said housing, a plurality of connector elements carried by said connector bar and matable with the electrical connectors disposed along one edge of said logic cards, conductive means connecting appropriate ones of said connector elements, retaining means mounted proximate the open bottom of said chassis and serving to releasably retain said logic cards in said chassis, and latch means resiliently securing said retaining means in card retaining position.

2. The device of claim 1 wherein:

said conductive means provide all inter-card connections for said logic cards.

3. Logic circuit mounting means comprising:

a plurality of logic cards having electrical connectors disposed along opposite edges thereof; and a card-mounting chassis having an open-bottomed generally box-like housing, a connector bar mounted in said housing, a plurality of connector elements carried by said connector bar and matable with the electrical connectors disposed along one edge of said logic cards, conductive means connecting appropriate ones of said connector elements, and retaining means serving to releasably retain said logic cards in said chassis including;

a pair of generally L-shaped retaining members hingedly secured to the sides of said chassis and formed with inwardly projecting flanges extending towards each other across the open bottom of said housing to underlie the edges of said logic cards, and latch means resiliently securing said retaining members in card retaining positions.

4. The device of claim 1 further comprising:

connector means mounted on the device to be controlled and matable with the electrical connectors disposed along the other edge of said cards while said cards are retained in said chassis.

5. The device of claim 4 wherein all connections between said logic cards and external equipment are made through said connector means.

* * * * *